(12) United States Patent
Fuergut et al.

(10) Patent No.: US 8,901,739 B2
(45) Date of Patent: Dec. 2, 2014

(54) EMBEDDED CHIP PACKAGE, A CHIP PACKAGE, AND A METHOD FOR MANUFACTURING AN EMBEDDED CHIP PACKAGE

(71) Applicant: Infineon Technologies AG, Neubiberg (DE)

(72) Inventors: Edward Fuergut, Dasing (DE); Horst Theuss, Wenzenbach (DE); Walter Diez, Regenstauf (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/705,367

(22) Filed: Dec. 5, 2012

(65) Prior Publication Data

US 2014/0151701 A1 Jun. 5, 2014

(51) Int. Cl.
*H01L 23/488* (2006.01)
*H01L 29/84* (2006.01)
*H01L 21/56* (2006.01)
*H01L 21/67* (2006.01)
*H01L 23/48* (2006.01)

(52) U.S. Cl.
CPC .............. *H01L 23/488* (2013.01); *H01L 29/84* (2013.01); *H01L 21/56* (2013.01); *H01L 21/67242* (2013.01); *H01L 23/48* (2013.01)
USPC .............................. 257/773; 257/43; 257/415

(58) Field of Classification Search
CPC ............. H01L 2224/3265; H01L 2224/02331; H01L 23/481; H01L 2224/02311; H01L 2224/0233; H01L 2225/06506; H01L 2924/14; H01L 33/62; H01L 22/32
USPC ................... 257/E21.511, E25.029, E21.705, 257/E21.606, E23.019, E23.061, E23.124, 257/E23.067, E23.07, E23.01, E21.508
See application file for complete search history.

(56) References Cited

U.S. PATENT DOCUMENTS

| | | | |
|---|---|---|---|
| 5,366,906 A * | 11/1994 | Wojnarowski et al. | 438/17 |
| 5,594,273 A * | 1/1997 | Dasse et al. | 257/620 |
| 6,744,067 B1 * | 6/2004 | Farnworth et al. | 257/48 |
| 6,784,020 B2 * | 8/2004 | Lee et al. | 438/106 |

* cited by examiner

*Primary Examiner* — Zandra Smith
*Assistant Examiner* — Paul Patton

(57) ABSTRACT

An embedded chip package is provided. The embedded chip package includes a plurality of chips; encapsulation material embedding the plurality of chips; at least one electrical redistribution layer electrically connected to the plurality of chips; and a common terminal connected to the at least one electrical redistribution layer, wherein the common terminal provides an interface to at least one of transmit and receive a common electrical signal between the plurality of chips and the common terminal.

19 Claims, 14 Drawing Sheets

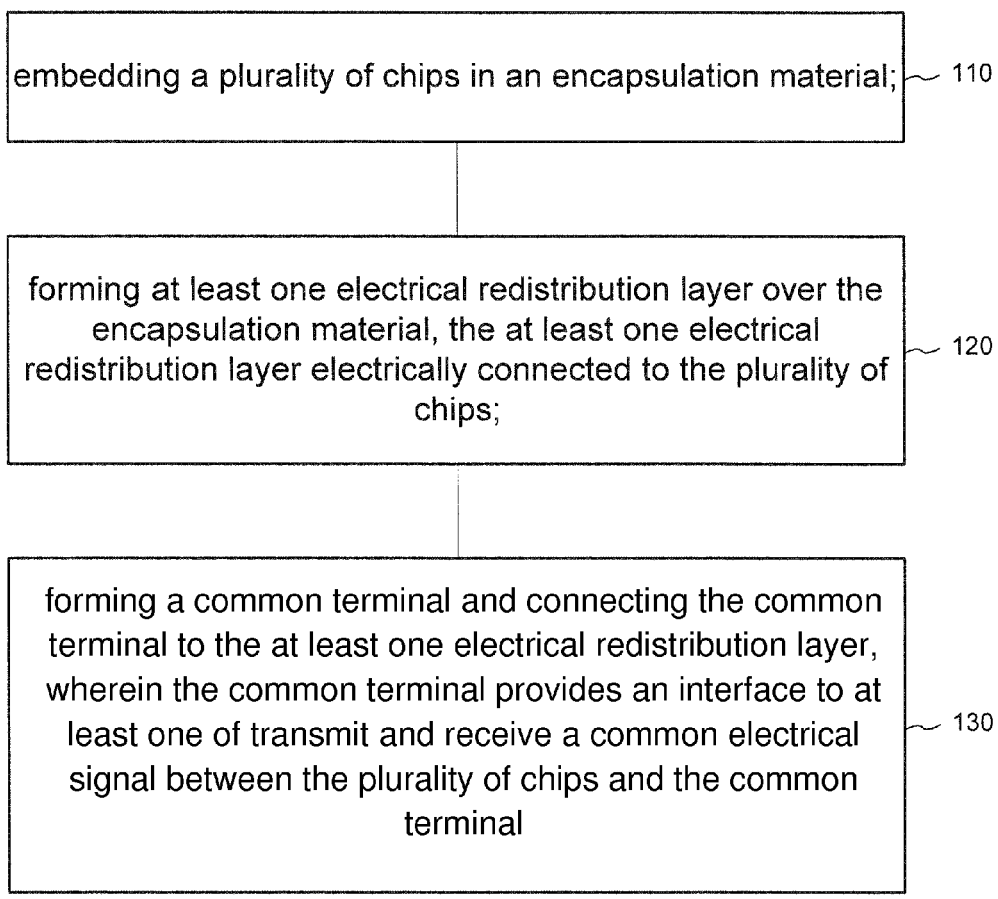

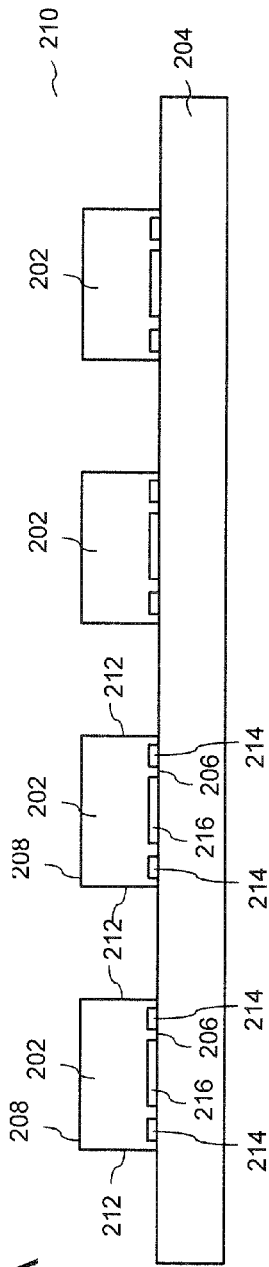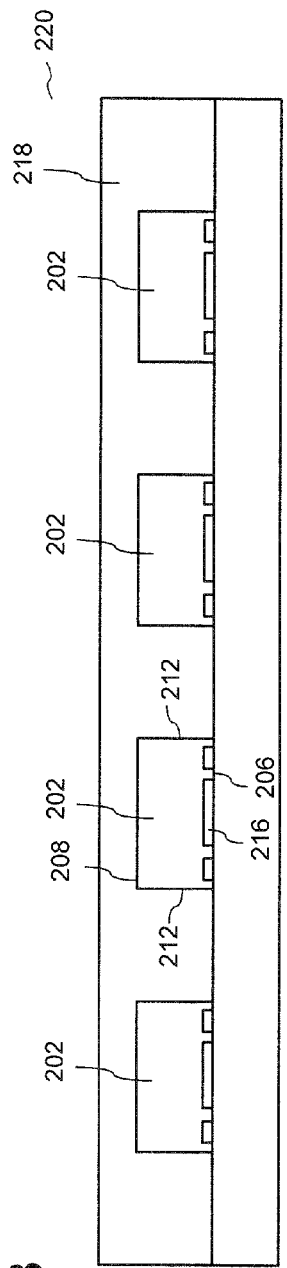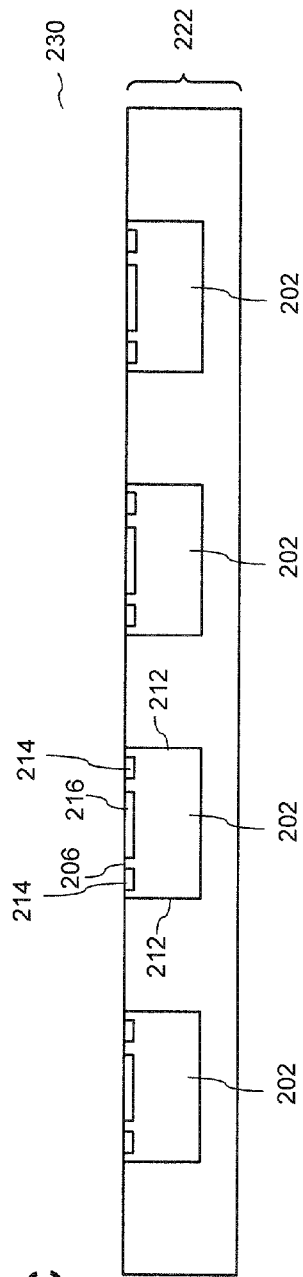

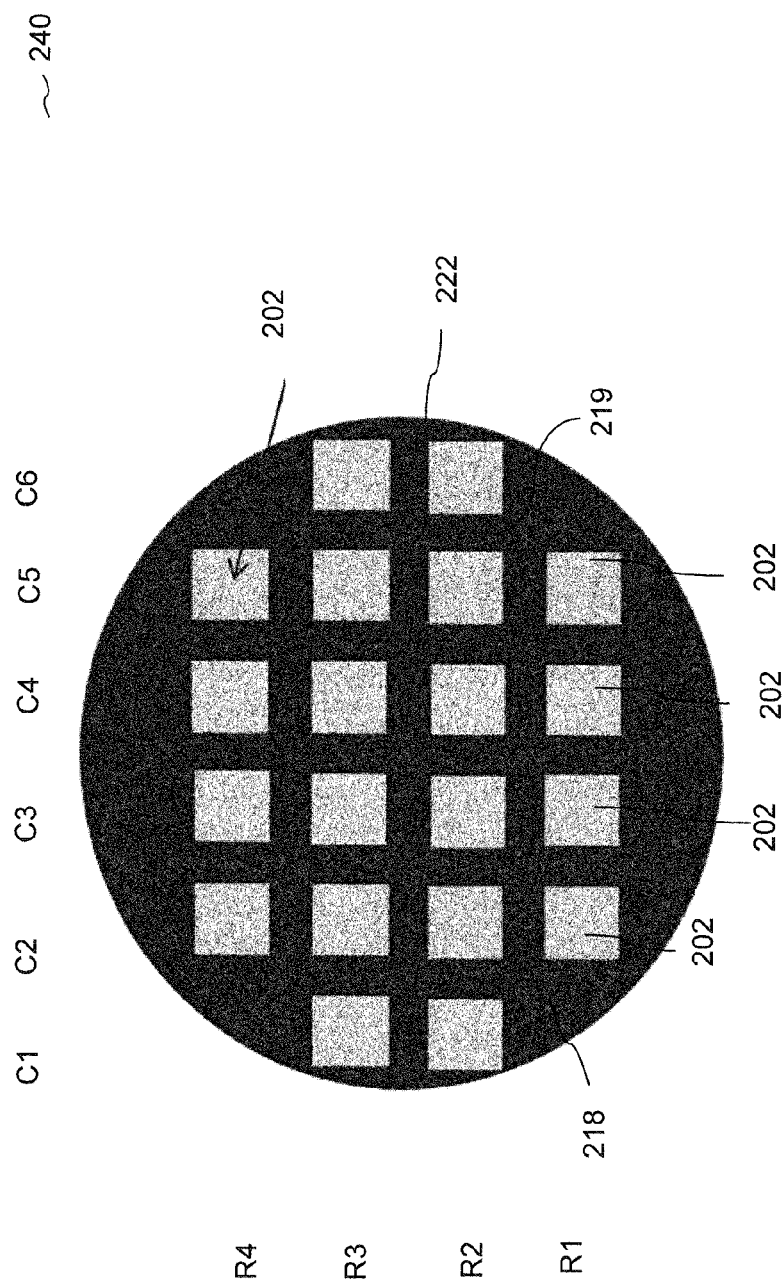

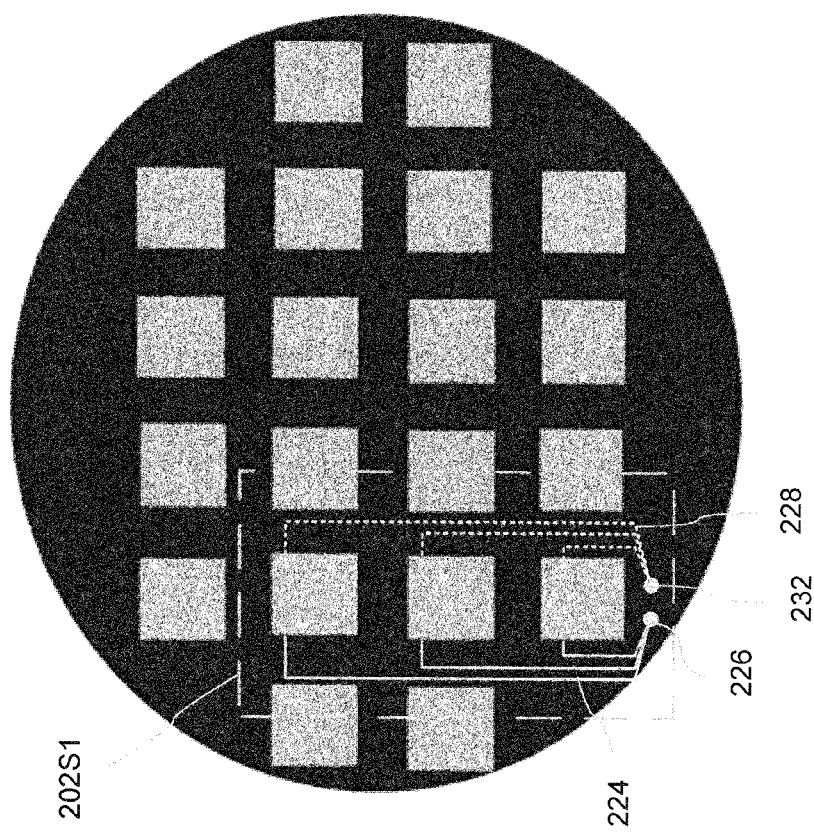

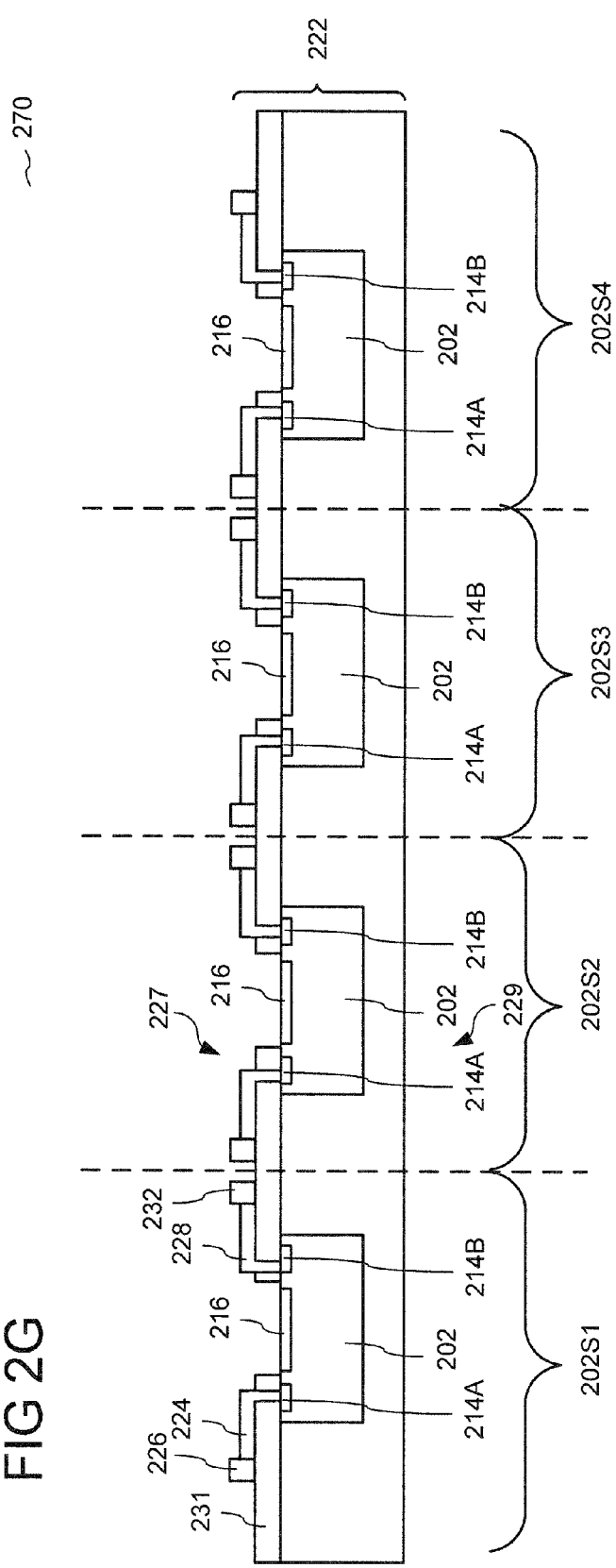

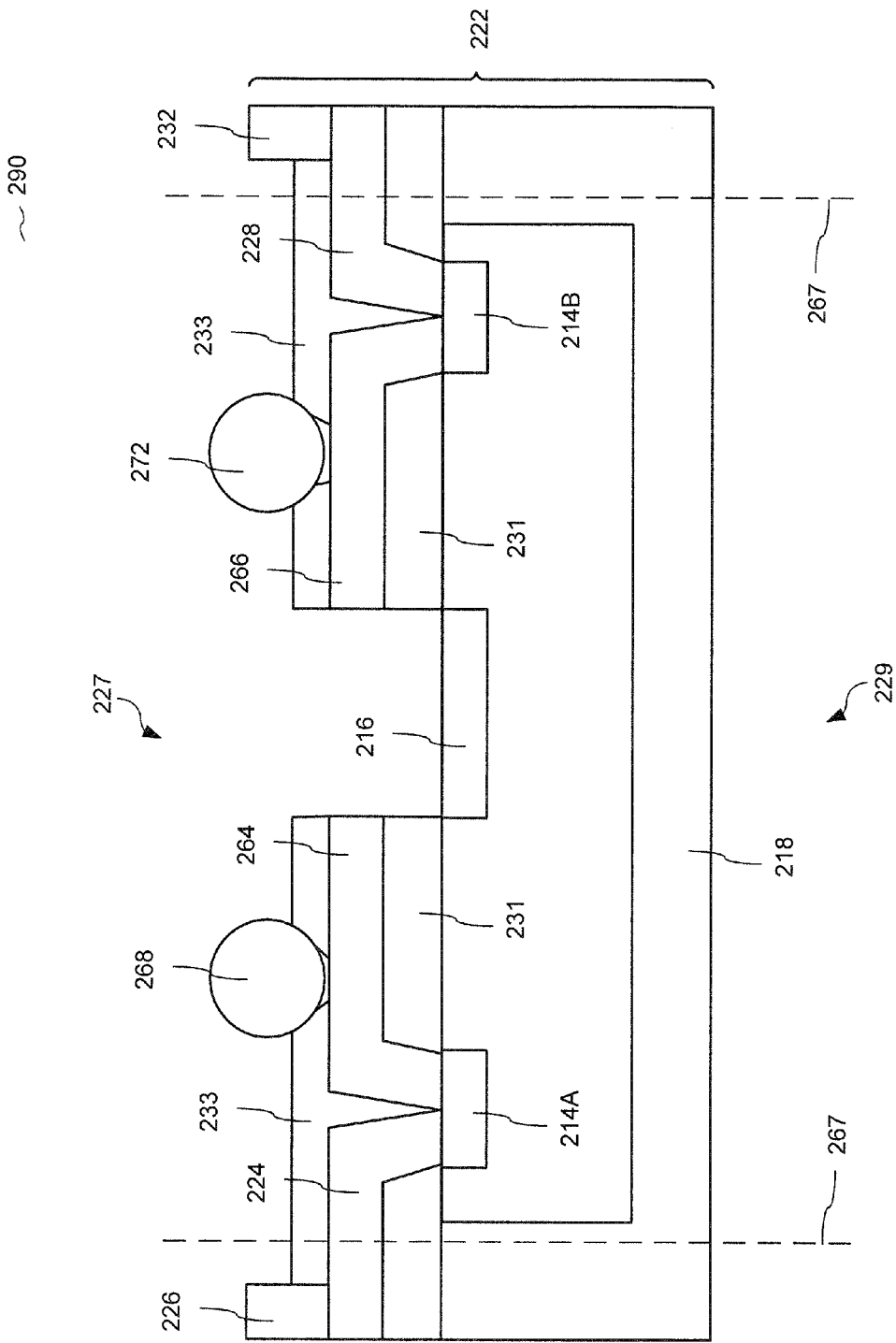

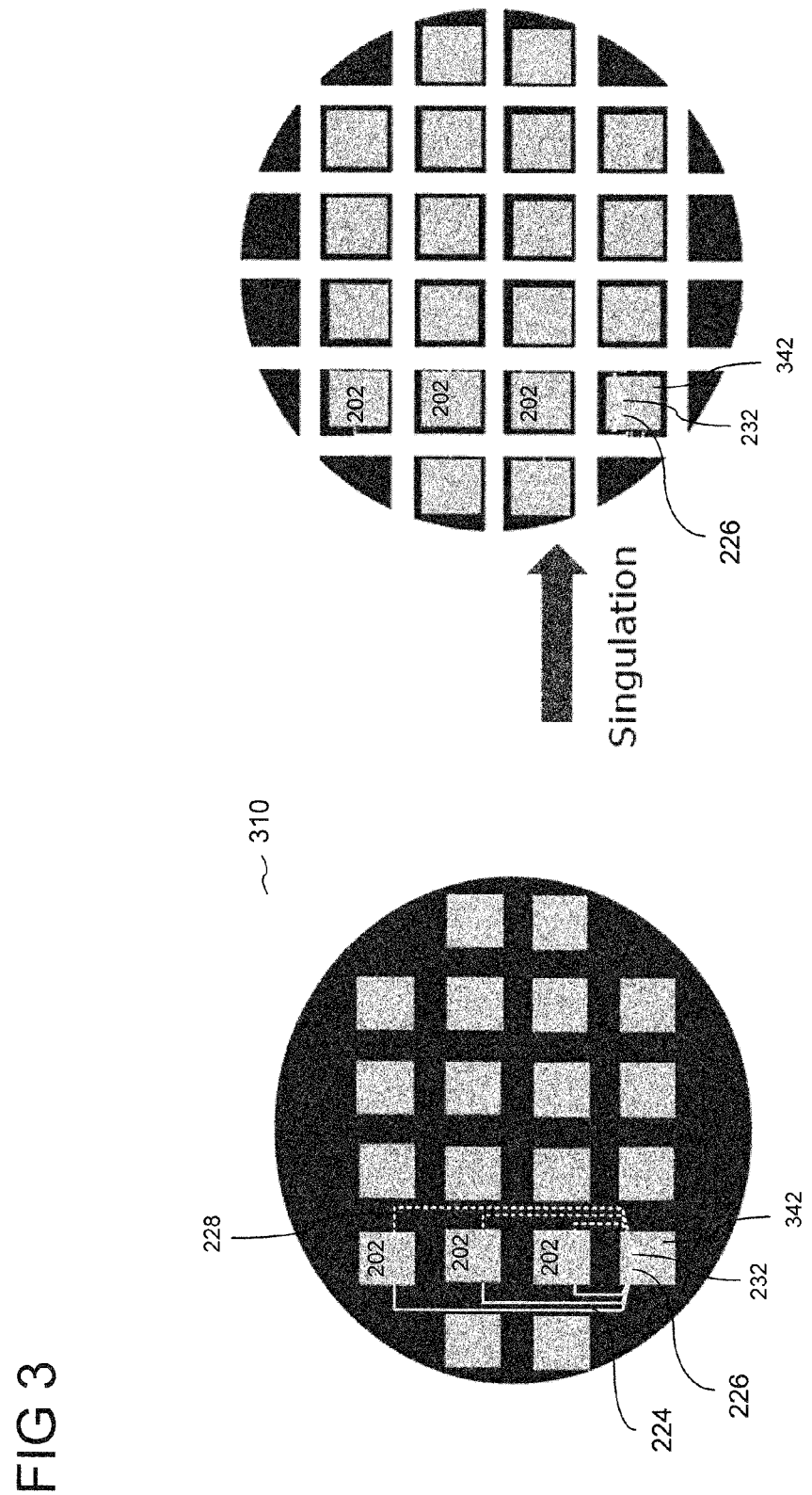

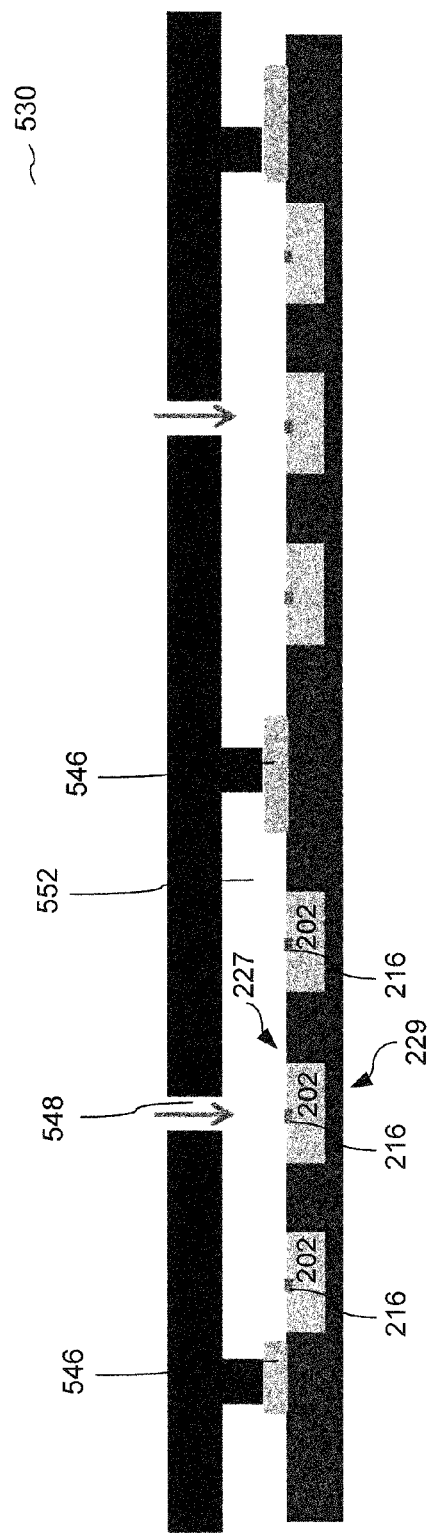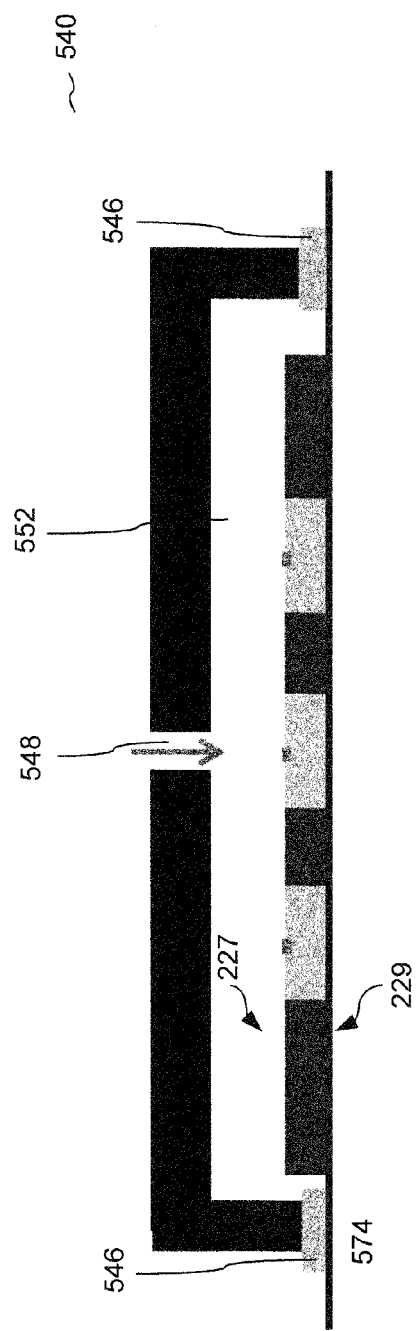

EMBEDDED CHIP PACKAGE, A CHIP PACKAGE, AND A METHOD FOR MANUFACTURING AN EMBEDDED CHIP PACKAGE

TECHNICAL FIELD

Various embodiments relate generally to an embedded chip package, a chip package, and a method for manufacturing an embedded chip package.

BACKGROUND

Sensors of today must be extensively tested and calibrated. Different levels of pressure, in combination with different temperatures may be applied to each pressure sensor component for testing. Complex measurements are also required, particularly if testing also includes movement, such as testing gyro sensors at different angles, or with different accelerations. These complex measurements may be required if pressure sensors are combined with acceleration sensors or gyro sensors, such as those used as tire pressure sensors. Current tests are extensive and expensive as test conditions are administered serially on individual components. Current testing standards allow for only very few components to be tested in parallel. Electrical contacting of the chip for testing also presents a complex challenge.

SUMMARY

Various embodiments provide an embedded chip package including: a plurality of chips; encapsulation material embedding the plurality of chips; at least one electrical redistribution layer electrically connected to the plurality of chips; and a common terminal connected to the at least one electrical redistribution layer, wherein the common terminal provides an interface to at least one of transmit and receive a common electrical signal between the plurality of chips and the common terminal.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 shows a method for manufacturing an embedded chip package according to various embodiments;

FIGS. 2A to 2I show illustrations in various views for performing a method for manufacturing an embedded chip package according to various embodiments;

FIG. 3 shows an embedded chip package according to various embodiments;

FIGS. 5A to 5D show a testing arrangement and a method for performing testing on an embedded chip package according to various embodiments.

DETAILED DESCRIPTION

Figure 2F:
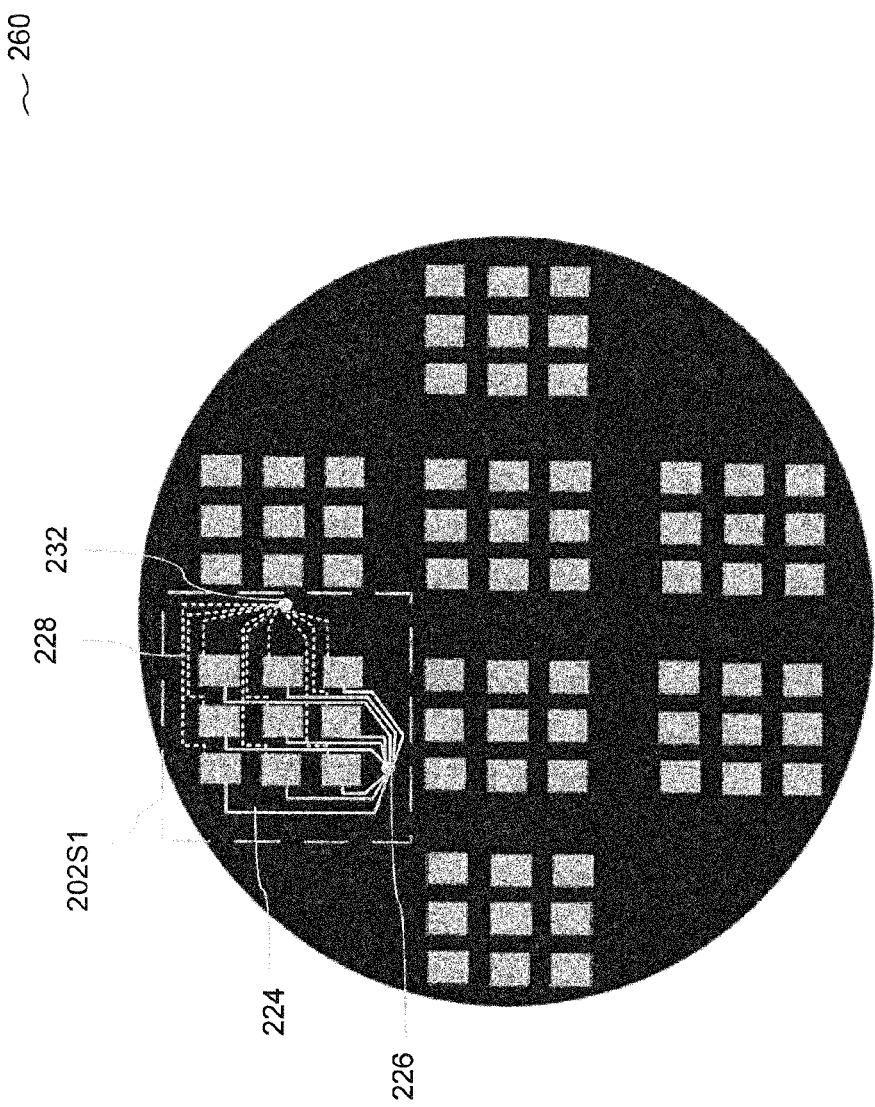

The following detailed description refers to the accompanying drawings that show, by way of illustration, specific details and embodiments in which the invention may be practiced.

The word "exemplary" is used herein to mean "serving as an example, instance, or illustration" or the like. Any embodiment or design described herein as "exemplary" is not necessarily to be construed as preferred or advantageous over other embodiments or designs.

The word "over" is used herein to describe forming a feature, e.g. a layer, "over" a side or surface, and may be used to mean that the feature, e.g. the layer may be formed "directly on," e.g. in direct contact with, the implied side or surface. The word "over" may also be used herein to describe forming a feature, e.g. a layer "over" a side or surface, and may be used to mean that the feature, e.g. the layer may be formed "indirectly on" the implied side or surface with one or more additional layers being arranged between the implied side or surface and the formed layer.

Various embodiments provide an efficient and inexpensive test for sensors. The embodiments include pressure sensors or pressure sensor modules, which may be calibrated and/or tested under different pressures and temperatures. The pressure sensors or pressure modules may be constructed or assembled using different embedding technologies, such as embedded wafer level ball grid array (eWLB) technology or BLADE technology. In the embodiments, a plurality of electrical components in a substantially regular arrangement, or an entire embedded chip package including a plurality of electrical components or chips, may be tested, before individualizing the embedded chip package into separate chip packages or modules. The embedded chip package may be round, e.g. in the case of eWLB or rectangular, e.g. in the case of BLADE technologies. The application of the test conditions, e.g. different pressures and/or temperatures and/or accelerations and/or tilting angles, may be applied to a plurality of electrical components in the embedded chip package, e.g. to a subset of all the electrical components in the embedded chip package or all the electrical components in the embedded chip package, simultaneously.

According to various embodiments, the electrical contacting and/or measurement of the plurality of components may be carried out efficiently by contacting all or at least a plurality of components in the embedded chip package at the same time. This may be carried out through a pin selection board; or using a multiplexer; or wiring the plurality of components at definite contact positions in the embedded chip package. The contacts need then only be contacted once, and may then be connected to the test equipment. Furthermore, the fabrication of the test wires may be integrated into back end processing. In other words, the test wires may be fabricated simultaneously with the fabrication of other electrical interconnects which may belong to the final chip package.

According to various embodiments, electrical wiring may be provided in the embedded chip package before individualization and/or separation of the individual chips from each other. Furthermore, as a result, test conditions, such as pressure levels, may be applied simultaneously to a subset of all the plurality of chips or all the chips in the embedded chip package. One or more further components may also be placed in the embedded chip package for testing. These further components may include logic chips and/or sensor chips such as temperature sensor chips. According to various embodiments, the electrical wiring may be carried out by forming conductive tracks in the kerf regions, which may be at least in part removed, during individualization, e.g. by dicing or sawing. In some embodiments, a logic circuit electrically connected to or forming at least part of a testing circuit may also be disposed or housed in the embedded chip package. A logic circuit in the test apparatus, which may also be formed within the embedded chip package, may allow for switching through individual components and their individual measurements.

Various embodiments therefore provide an elegant and low-cost test embedded chip package and chip arrangement for highly efficient testing.

FIG. 1 shows method 100 for manufacturing an embedded chip package according to various embodiments. Method 100 may include:

embedding a plurality of chips in an encapsulation material (in 110);

forming at least one electrical redistribution layer over the encapsulation material, the at least one electrical redistribution layer electrically connected to the plurality of chips (in 120); and forming a common terminal and connecting the common terminal to the at least one electrical redistribution layer, wherein the common terminal provides an interface to at least one of transmit and receive a common electrical signal between the plurality of chips and the common terminal (in 130).

FIGS. 2A to 2I show illustrations in various views for performing method 100 for manufacturing an embedded chip package according to various embodiments.

The method may include embedding a chips 202, e.g. which may be referred to collectively as plurality of chips 2021 to 202n in an encapsulation material to form an embedded chip package. The embedded chip package may form an intelligent workpiece or test board, which includes the plurality of chips 2021 to 202n.

Each chip 202 (referred to as chip 202) may include a semiconductor die. Each chip 202 may include at least one pressure sensor. In other words, each chip 202 may be a pressure sensor chip. Each chip 202 may include sensing portion 216 which may include a sensing input 216A (not shown) and a sensor circuit 216B (not shown). Sensing input 216A may receive and react to an external stimulus of pressure, such as a change in pressure. For example, sensing input 216A may include a membrane which may be configured to exhibit a change in an electrical property such as a change in electrical resistance due to a change in pressure applied to sensing input 216A. Sensing circuit 216B may include a circuit electrically connected to sensing input 216A, which may be configured to convert a change in property of the sensing input 216A in response to an applied stimulus, e.g. pressure, to an output signal 237 (not shown) which may be proportional to the applied stimulus. Sensing circuit 216B may include, according to an embodiment, a Wheatstone bridge circuit. According to other embodiments, sensing circuit 216B may include at least one of a capacitive sensing circuit, electromagnetic sensing circuit and piezoelectric sensing circuit. In other words, output signal 237 may include at least one of a voltage signal, capacitive signal, electromagnetic signal and piezoelectric signal.

Each chip 202 of plurality of chips 2021 to 202n, may include a respective chip front side 206; chip back side 208; chip sidewalls 212; and one or more contact pads 214 formed over chip front side 206. Each chip 202 may include sensing portion 216 formed over chip front side 206. Each chip 202 may include a semiconductor die, or include at least part of a semiconductor wafer. Each chip 202 may have undergone front end processing, e.g. front end of line (FEOL) processes and back end of line (BEOL) processes to form sensing portions 216, e.g. sensing inputs 216A and sensing circuits 216B of chips 202. Each chip 202 may form at least part of a semiconductor wafer, the semiconductor wafer including at least one of doped silicon or undoped silicon, germanium, gallium arsenide (GaAs), indium phosphide (InP) and silicon carbide (SiC). Sensing portion 216 of each chip 216 may be electrically connected to one or more contact pads 214 on each chip 202. For example, sensing circuit 216B of each chip 216 may be electrically connected to one or more contact pads 214 on each chip 202. Contact pads 214 may be configured to at least one of transmit and/or receive an electrical signal to and/or from the sensing portion 216. For example, contact pads 214A and 214B may be input terminals for providing an excitation voltage (for example, a common voltage such as Ground voltage and VDD respectively) to sensing circuit 216B. In various embodiments, each chip 202 may include a plurality of chips in one package (multi-chip package). In various embodiments, a first chip of the plurality of chips in one package may include a sensor chip portion and a second chip of the plurality of chips in the same package may include a logic circuit, e.g. connected to the sensor chip portion of the other chip in the same package. In various embodiments, the chip 202 may include other chips such as e.g. transceiver chips (e.g. HF transceiver chips), amplifier chips, filter chips (e.g. surface acoustic wave filter chips and/or bulk acoustic wave filter chips).

Plurality of chips 2021 to 202n may be embedded in encapsulation material using various processes. It may be understood that plurality of chips 2021 to 202n may refer to one or more chips e.g. two, three, four, or more, or even tens, hundreds or even thousands of chips, i.e. n may be an arbitrary whole number. Each chip of the plurality of chips may have a chip thickness in the range from about 10 µm to about 775 µm.

In an embodiment, as shown in cross-sectional view 210 of FIG. 2A, using an eWLB approach, plurality of chips 2021 to 202n may be placed or arranged over temporary carrier 204. Plurality of chips 2021 to 202n may be arranged over temporary carrier 204 with each of their front sides 206 facing and arranged directly on temporary carrier 204.

Subsequently, as shown in view 220 of FIG. 2B, encapsulation material 218 may be formed over plurality of chips 2021 to 202n wherein encapsulation material 218 may cover chip back sides 208 and chip sidewalls 212 of plurality of chips 2021 to 202n. Encapsulation material 218 may therefore at least partially surround plurality of chips 2021 to 202n. Encapsulation material 218 may include an electrically insulating material, such as an organic based material. Plurality of chips 2021 to 202n may be commonly connected to each other via encapsulation material 218.

As shown in view 230 of FIG. 2C, temporary carrier 204 may be removed leaving embedded chip package 222 which may also be referred to as a reformed wafer. Embedded chip package 222 may include plurality of chips 2021 to 202n embedded in encapsulation material 218. Embedded chip package 222 may be arbitrarily shaped. According to some embodiments, embedded chip package 222 may be round or rectangular in shape, i.e. panel sized. Contact pads 214 formed over each of chip front sides 206 may be substantially free from encapsulation material 218. Sensing portion 216 formed over each of chip front sides 206 may also be substantially free from encapsulation material 218. Contact pads 214 may be electrically connected to sensing portion 216.

FIG. 2D shows top view 240 of embedded chip package 222 including plurality of chips 2021 to 202n embedded in encapsulation material 218. Plurality of chips 2021 to 202n may be arranged regularly, for example, in rows (R) and/or columns (C), e.g. in reticles. Encapsulation material 218 may be formed between plurality of chips 2021 to 202n. Parts of embedded chip package 222 not occupied by plurality of chips 2021 to 202n, e.g. between chips, and/or edge regions of embedded chip package 222, may be referred to as kerf regions 219. Kerf regions may be disposed off after individualizing and dicing of chips.

As shown in cross-sectional views 250 and 260 of FIGS. 2E and 2F, the formation of electrical redistribution layers 224, 228 as test wires within the embedded chip package 222 may be carried out in kerf regions 219. The formation of electrical interconnects (not shown) which are to be part of the final chip package may also be carried out together with the formation of the electrical redistribution layers. Electrical redistribution layers 224, 228 and electrical interconnects may be carried out by at least one of: electroplating, sputtering and evaporation.

At least one electrical redistribution layer 224 may be electrically connected to a subset $202s1$ of the plurality of chips 2021 to 202n. It may be understood that a subset of plurality of chips 2021 to 202n may refer to a fraction (less than 1) of total number, n, of plurality of chips 2021 to 202n in embedded chip package 222. A subset may also refer to all of the total number, n, of plurality of chips 2021 to 202n in embedded chip package 222. Electrical redistribution layer 224 may be formed over encapsulation material 218, e.g. over package front side 227 or over package back side 229, in regions between plurality of chips 2021 to 202n, i.e. in kerf regions 219. Common terminal 226 may be formed over encapsulation material 218, e.g. over package front side 227 or over package back side 229, in regions between plurality of chips 2021 to 202n. Common terminal 226 may also be formed and connected, e.g. electrically connected to electrical redistribution layer 224. Common terminal 226 may provide an interface to at least one of transmit and receive a common electrical signal 234 between the plurality of chips, e.g. via electrical redistribution layer 224, and common terminal 226. Electrical redistribution layer 224 may be electrically connected to a respective first contact pad 214A of each of the one or more contact pads 214. During testing, common terminal 226 may be connected to a test circuit, or form at least part of a test circuit, which may provide a voltage input, e.g. Ground voltage to each respective first contact pad 214A of chips 202 within subset $202s1$.

At least one further electrical redistribution layer 228 may be electrically connected to a subset $202s1$ of the plurality of chips 2021 to 202n. This may be the same subset of the plurality of chips plurality of chips 2021 to 202n to which electrical redistribution layer 224 may be electrically connected. Further electrical redistribution layer 228 may be electrically connected to a respective second contact pad 214B of each of plurality of chips 2021 to 202n. Further electrical redistribution layer 228 may be formed over encapsulation material 218. Similarly to electrical redistribution layer 224 further electrical redistribution layer 228 may be formed over encapsulation material 218, e.g. over package front side 227 or over package back side 229, in regions between plurality of chips 2021 to 202n. Furthermore, further common terminal 232 may be formed over encapsulation material 218, e.g. over package front side 227 or over package back side 229, in regions between plurality of chips 2021 to 202n. Further common terminal 232 may be formed and connected, e.g. electrically connected, to further electrical redistribution layer 228, wherein further common terminal 232 may provide an interface to at least one of transmit and receive a further common electrical signal 236 between further electrical redistribution layer 228 and further common terminal 232. During testing, further common terminal 232 may be connected to a test circuit, or form at least part of a test circuit, which may provide a voltage input, e.g. VDD voltage to each respective second contact pad 214B of chips 202 within subset $202s1$.

In other words, both electrically redistribution layer 224 and further electrical redistribution layer 228 may be electrically connected to subset $202s1$ of plurality of chips 2021 to 202n in embedded chip package 222.

Top view 260 of FIG. 2F shows another embodiment, wherein electrically redistribution layer 224 and further electrical redistribution layer 228 may be electrically connected to subset $202s1$ of total number of plurality of chips 2021 to 202n. As may be understood from FIGS. 2G and 2H, the arrangement of plurality of chips 2021 to 202n may be varied according to the desired electrical wiring provided by electrically redistribution layer 224 and further electrical redistribution layer 228. Plurality of chips 2021 to 202n may be arranged in regular patterns, e.g. in reticles. The one or more dies/reticles may include a specific chip for testing purposes. In these arrangements, electrical test contacts may be arranged far from sensitive components in the chip sensor, therefore, any impact of the sensor by mechanical test pins may be avoided.

FIGS. 2E and 2F show, for simplicity, only one electrical redistribution layer 224 per chip connected to each common terminal 226. Similarly, only one further electrical redistribution layer 228 per chip is shown to be connected to each further common terminal 232. It may be understood however, that various embodiments may not be restricted by these illustrations, and that it may be possible for a plurality of electrical redistribution layers 224 to be connected to common terminal 226 and similarly, for a plurality further electrical redistribution layers 228 per chip to be electrically connected to further common terminal 232. It may also be understood that for simplicity, test wiring via electrical redistribution layer 224 and further electrical redistribution layer 228 is shown only for one subset of chips from plurality of chips 2021 to 202n. Embedded chip package 222 may in fact include more than one subset of chips which may be similarly wired.

Figure 2H:
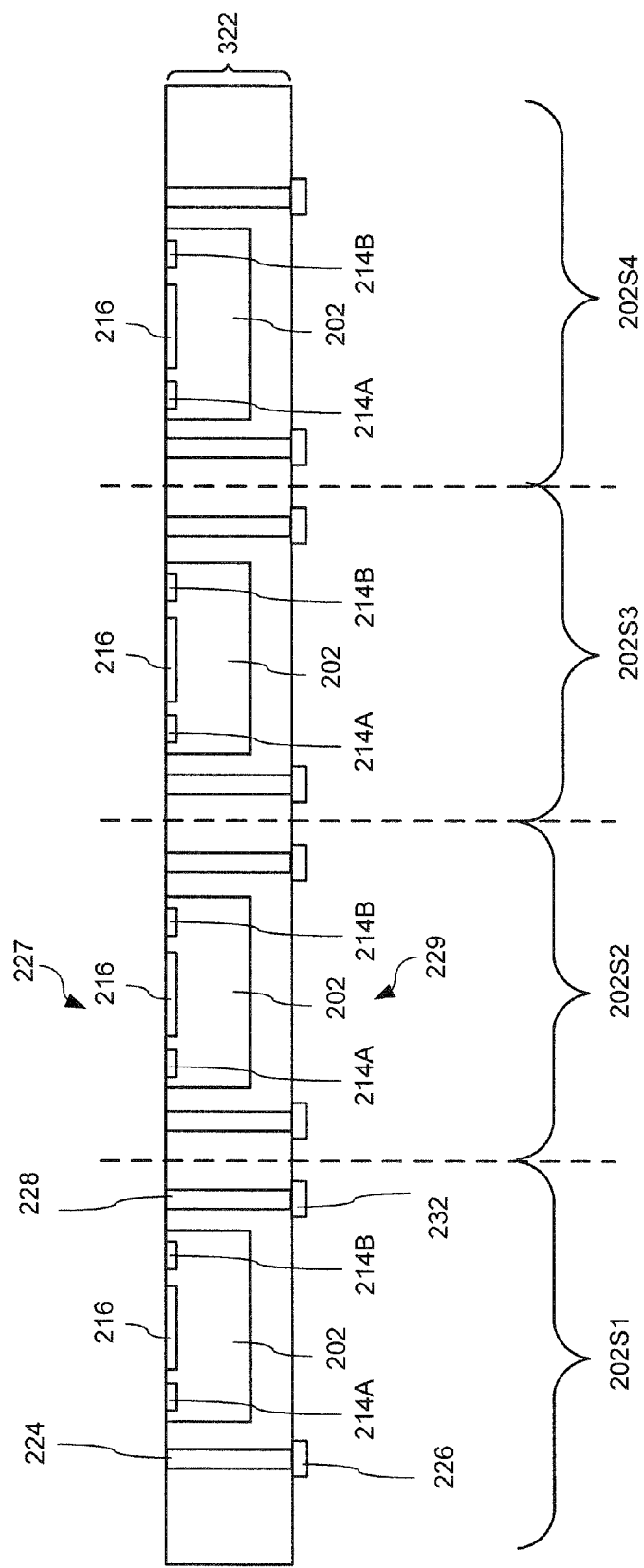

FIGS. 2G and 2H show cross-sectional views 270 and 280 respectively of how electrical redistribution layers 224 and further electrical redistribution layers 228 may be formed in embedded chip package 222 according to various embodiments. In one embodiment, as shown in view 270, electrically insulating material 231 may be selectively formed over package front side 227. Electrically insulating material 231 may be formed over chip front sides 206 as well as contact pads 214. Lithography and etching may be carried out to etch through selected portions of electrically insulating material 231 to expose contact pads 214, for example to form holes over a first portion of contact pads 214 by selectively removing portions of encapsulation material 218. Subsequently, electrical redistribution layers 224 and further electrical redistribution layers 228 may be formed in the holes over a first portion of contact pads 214. For example, electrical redistribution layer 224 may be formed over a first portion of first contact pad 214A and further electrical redistribution layers 228 may be formed over a first portion of second contact pad 214B. At least part of electrical redistribution layers 224 and further electrical redistribution layers 228 may also be formed over encapsulation material 218.

It may be understood that electrical redistribution layers 224 and further electrical redistribution layers 228 may be configured to provide the electrical wiring for connecting to a testing circuit, and may be separated from the final chip package after testing. Electrical interconnects 264, 266 (shown in FIG. 2I) may also be formed simultaneously during the formation of electrical redistribution layer 224 and further electrical redistribution layers 228 and/or using similar fabrication processes. Electrical interconnects 264, 266 may provide the electrical wiring for the sensor, and may remain as part of the final chip package.

As shown in cross-sectional view 290 of FIG. 2I, electrical interconnect 264 may be formed over a second portion of first contact pad 214A and further electrical interconnect 266 may be formed over a second portion of second contact pad 214B. At least part of electrical interconnect 264 and further electrical interconnect 266 may also be formed over encapsulation material 218. Further electrically insulating material 233 may be formed over electrical interconnect 264, further electrical interconnect 266 and electrical redistribution layers 224 and further electrical redistribution layers 228. For example, further electrically insulating material 233 may be deposited over package front side 227 which covers and at least partially surrounds electrical interconnect 264, further electrical interconnect 266 and electrical redistribution layers 224 and further electrical redistribution layers 228. Subsequently, solder structures 268, 272 may be joined to electrical interconnect 264 and further electrical interconnect 266. In order for this to be achieved, portions of further electrically insulating material 233 covering electrical interconnect 264 and further electrical interconnect 266 may be removed to expose at least one portion respectively of electrical interconnect 264 and further electrical interconnect 266. In a simultaneous process, portions of further electrically insulating material 233 covering electrical redistribution layer 224 and further electrical redistribution layer 228 may be removed to expose at least one portion respectively of electrical redistribution layer 224 and further electrical redistribution layer 228.

Solder structures 268, 272, e.g. a solder ball, or solder joint, may be formed in the exposed respective parts of electrical interconnect 264 and further electrical interconnect 266. In other words, first solder structure 268 may be formed in electrical connection with electrical interconnect 264, and second solder structure 272 may be formed in electrical connection with further electrical interconnect 266. Common terminal 226 and further common terminal 232 may be formed in the exposed respective parts of electrical redistribution layer 224 and further electrical redistribution layer 228. For example, common terminal 226 and further common terminal 232 may be formed over encapsulation material 218, e.g. in holes formed through further electrically insulating material 233. Therefore, common terminal 226 may be formed in electrical connection with electrical redistribution layers 224. Furthermore, further common terminal 232 may be formed in electrical connection with further electrical redistribution layers 228.

Electrically redistribution layer 224, further electrical redistribution layer 228, common terminal 226 and further common terminal 232 may be formed over package front side 227 of embedded chip package 222. Solder structures 268, 272 may also be formed over package front side 227. Electrically redistribution layer 224, further electrical redistribution layer 228, common terminal 226 and further common terminal 232 may each include at least one metal or alloy of at least one of copper, nickel, iron, silver, gold and palladium. Electrically redistribution layer 224, further electrical redistribution layer 228, common terminal 226 and further common terminal 232 may be deposited by at least one of: electroplating, sputtering and evaporation. Electrical interconnects 264, 266 may each include at least one metal or alloy of at least one of copper, nickel, iron, silver, gold and palladium. Electrical interconnects 264, 266 may be deposited by at least one of: electroplating, sputtering and evaporation. The above mentioned layers and interconnects may have a thickness in the range from about 3 µm to about 50 µm.

In another embodiment, as shown in view 280, contact pads 214 may be routed from package front side 227 to package back side 229. Electrical redistribution layer 224 may include first through-package-via 254 which may electrically redirect first contact pad 214A from package front side 227 to package back side 229 and to common terminal 226. Further electrical redistribution layer 228 may include second through-package-via 255 which may electrically redirect second contact pad 214B from package front side 227 to package back side 229 and to further common terminal 232. At least part of electrically redistribution layer 224, further electrical redistribution layer 228, common terminal 226 and further common terminal 232 may be formed over package back side 229 of embedded chip package 222. Electrical interconnects 264, 266 may also be formed simultaneously during the formation of electrical redistribution layer 224 and further electrical redistribution layers 228, and may optionally be also routed from package front side 227 to package back side 229. In other words, solder structures 268, 272 may be formed on package back side 229. Optionally, electrical interconnects 264, 266 may optionally not be routed from package front side 227 to package back side 229. In other words, solder structures 268, 272 may be formed on package back side 227.

Testing of plurality of chips 202$_1$ to 202$n$ may subsequently be carried out. During testing, it may be possible that a series of different pressures may be applied to the chips undergoing testing. It may also be possible that each pressure of the series of different pressures may be applied at various temperatures. Common electrical signal 234 and further common electrical signal 234 may be applied to the chips undergoing testing and/or a variety of devices, simultaneously. For example, common electrical signal 234 and further common electrical signal 234 may be applied to common terminal 226 and further common terminal 232 respectively, wherein common terminal 226 and further common terminal 232 may be input terminals for an excitation voltage applied to sensing circuit 216B. Each chip 202 may include at least one third contact pad 214C (not shown), which may be a designated output contact pad for transmitting and/or receiving output signal 237. At least one common output terminal 262 (not shown) may be configured to receive a common output signal 237 between at least one output electrical redistribution layer and common output terminal 262. It may be understood that at least one third contact pad 214C, may be electrically connected to common output terminal 262 using processes similar to those already described above. For example, output electrical redistribution layer may be formed in a common process as electrically redistribution layer 224, further electrical redistribution layer 228. Similarly, common output terminal 262 may be formed in a common process with common terminal 226 and further common terminal 232. The test signals, may be transmitted and/or received from terminal 226 and/or further common terminal 232 from front side 206 with test pins.

As an example, common electrical signal 234 may be provided to a subset e.g. 202$s$1 or all, of plurality of chips 202$_1$ to 202$n$ simultaneously via common terminal 226. Common electrical signal 234 may be provided to a respective first contact pad 214A of each chip in the subset of chips. Common electrical signal 234 may be a ground voltage. Simultaneously, further common electrical signal 236 may be provided to a subset e.g. subset 202$s$1 or to all of plurality of chips 202$_1$ to 202$n$ via further common terminal 232. Further common electrical signal 236 may be provided to a respective second contact pad 214B of each chip in the subset of chips. Further common electrical signal 236 may be a voltage VDD. Electrical redistribution layer 224 and further electrical redistribution layer 228 may electrically connect the contact pads 214A, 214B of each chip to common terminal 226 and further common terminal 232 respectively. Furthermore, electrical redistribution layer 224 and further electrical redistribution layer 228 may configured to provide common electrical signal 234 and further common electrical signal 236 simultaneously. Therefore, the subset of chips to be tested simultaneously, that is without serially connecting and/or reconnecting each chip to a testing circuit. In other words, common terminal 226 and further common terminal 232 may contact each respective first contact pad and each respective second contact pad 214B of the subset of chips just once. Furthermore, a batch test may be applied to the subset of chips, by applying the voltages to common terminal 226 and further common terminal 232 just once. Testing may be carried out, batch-wise on embedded chip package 222. For example, embedded chip package 222 may include a plurality of subsets of chips which may each be batch tested as described before.

Pressure P1 may be applied to sensing input(s) 216A of the subset of chips. Output signal 237 may be generated due to the applied pressure P1, wherein output signal 237 may be proportional to the pressure P1 applied to sensing input(s) 216A. Output signal may be transmitted from sensing circuit 216B to third contact pad 214C, to at least one output electrical redistribution layer and to common output terminal 262. The testing process may be repeated for a series of pressures, e.g. P1, P2, P3, and/or for a series of temperatures, e.g. T1, T2, T3. When the subset of chips has been tested, the processes may be repeated for another subset of chips in embedded chip package 222.

After testing, individualization each of the plurality of chips 2021 to 202n from each other may be carried out. As shown in top view 290 of FIG. 2I, plurality of chips 2021 to 202n may each be individualized from each other by separating through dicing lines 267. For example, by dicing through electrical redistribution layer 224 and/or further electrical redistribution layer 228. For example, each of plurality of chips 2021 to 202n may be separated or diced apart from each other by dicing through electrical redistribution layer 224 and/or further electrical redistribution layer 228 and/or encapsulation material 218 and/or electrically insulating material 231 and/or further electrically insulating material 233. Each chip 202 of plurality of chips 2021 to 202n may be separated from at least part of electrical redistribution layer 224 and common terminal 226. Furthermore, each chip 202 of plurality of chips 2021 to 202n may be separated from at least part of further electrical redistribution layer 228 and further common terminal 232. It may be understood, that therefore, each chip package 610 may be separated from at least part of electrical redistribution layer 224 and/or common terminal 226 and/or further electrical redistribution layer 228 and/or further common terminal 232/.

Figure 6:
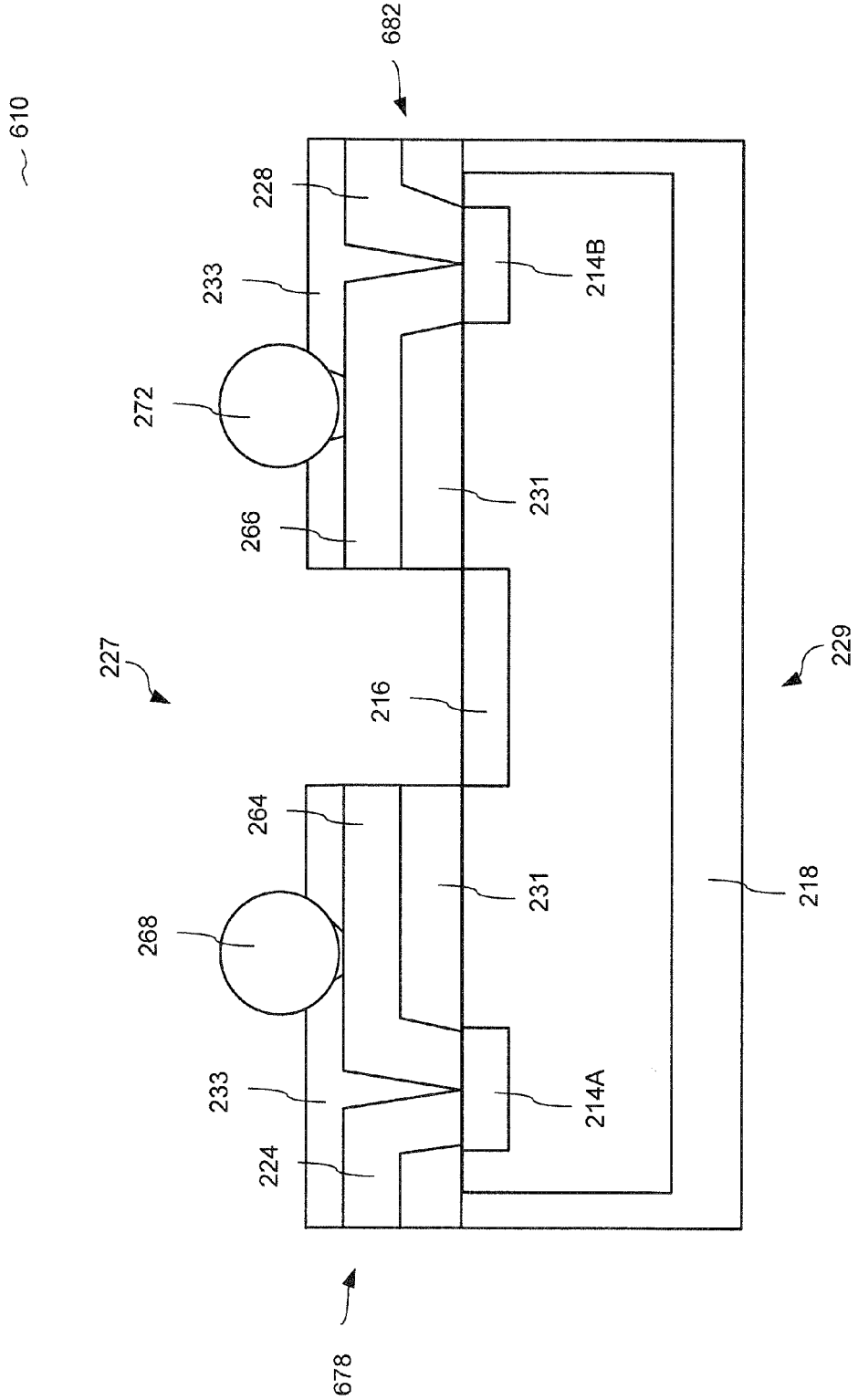
FIG. 6 shows a chip package according to various embodiments.

FIG. 6 shows chip package 610 according to an embodiment. Chip package 610 may be obtained after dicing through dicing lines 267.

Chip package 610 may include chip 202. Chip 202 may include sensing portion 216 and one or more contact pads 214 electrically connected to sensing portion 216. Chip package 610 may include electrical redistribution layer 224 electrically contacting at least one contact pad 214A. Electrical redistribution layer 224 may extend from at least one contact pad 214A to sidewall 678 of chip package 610, wherein a portion of electrical redistribution layer 224 may be exposed at sidewall 678 of chip package 610.

Chip package 610 may further include electrically insulating material 231, 233 at least partially surrounding chip 202 and electrical redistribution layer 224. The portion of electrical redistribution layer 224 exposed at sidewall 678 of chip package 610 may be free of electrically insulating material 231, 233. In other words, the exposed part of electrical redistribution layer 224 may be uncovered. Chip package may further include an electrical interconnect 264 electrically contacting contact pad 214A. Electrical interconnect 264 may be at least partially surrounded by electrically insulating material 231, 233, wherein at least part of electrical interconnect 264 may be connected to solder structure 268, which may be formed over electrically insulating material 231, 233/.

It may be understood that although only one chip 202, e.g. one pressure chip, is shown per chip package 610, it may be possible that each chip package 610 may include a system including more than one chip, i.e. more than one electrical component, and at least one pressure sensor chip 202.

FIG. 3 shows embedded chip package 322 according to various other embodiments. Embedded chip package 322 may include one or more or all of the features already described with respect to embedded chip package 222. In one embodiment however, embedded chip package 322 may include at least one further chip 342 which may include at least one of a calibrating circuit, a testing circuit and a multiplexing circuit. Further chip 342 may be included only for test purposes and may be removed by the singulation process. According to an embodiment, further chip 342 may include a logic circuit which may form at least part of, or be connected to a multiplexer, wherein the multiplexer may be configured to selectively transmit and/or receive at least one of common signal 234, further common signal 236 and/or output signal 237 to and/or from a selected chip or subset of chips. Further chip 342 may include a specific logic function which may simply be testing, e.g. which may enable scanning through various devices and/or temperature measurements. The further chip may be an individual chip also covered by the encapsulation material. As an alternative or in addition, the further chip may be implemented together (on the same matrix, substrate or wafer) with one chip of the plurality of chip (illustratively, this chip includes a "functional" chip as well as the test functionality as a master test chip controlling the testing of the chips all covered by the encapsulation material via the common redistribution layer).

In one embodiment, common terminal 226, further common terminal 232 and common output terminal 262 (not shown) may form at least part of further chip 342 as shown in view 310 of FIG. 3A. Further chip 342 may be disposed at least partially in encapsulation material 218 and electrically connected to plurality of chips 2021 to 202n. Further chip 342 may also be electrically connected to common terminal 226 and/or further common terminal 232. Further chip 342 may be configured to at least one of transmit and receive common electrical signal 234, e.g. Ground voltage, via common terminal 226. Furthermore, further chip 342 may be configured to at least one of transmit and receive further common electrical signal 236, e.g. voltage VDD, via further common terminal 232. Further chip 342 may be configured to at least one of transmit and receive common output signal 237 via common output terminal 262.

After testing, as described above, plurality of chips 2021 to 202n may each be individualized from each other by separating through electrical redistribution layer 224 and/or further electrical redistribution layer 228. For example, each of plurality of chips 2021 to 202n may be separated from at least part of electrical redistribution layer 224, at least part of further electrical redistribution layer 228, common terminal 226, further common terminal 232 and further chip 342. Dicing may be carried out through dicing lines 467. It may be understood that the parts separated from plurality of chips 2021 to 202n may then be discarded as they do not form part of the final chip package.

Figure 4A:
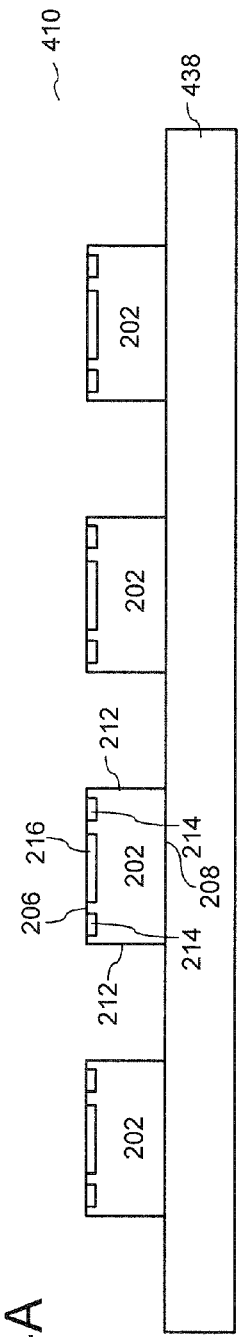
FIGS. 4A to 4C show a method for manufacturing an embedded chip package according to various embodiments.
Figure 4B:
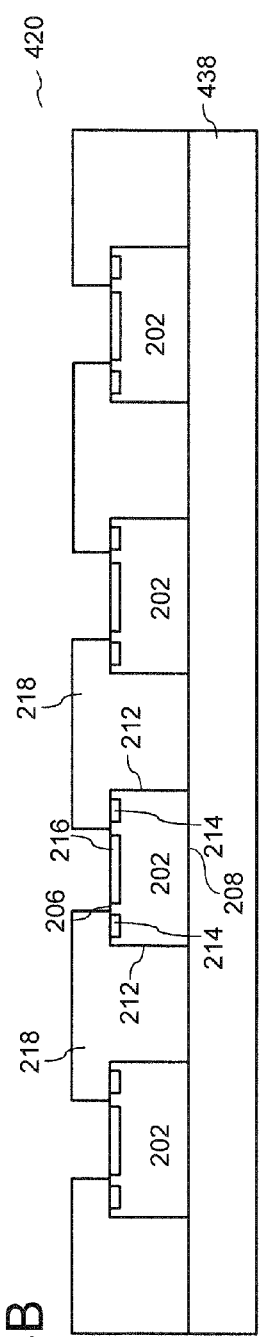
Figure 4C:
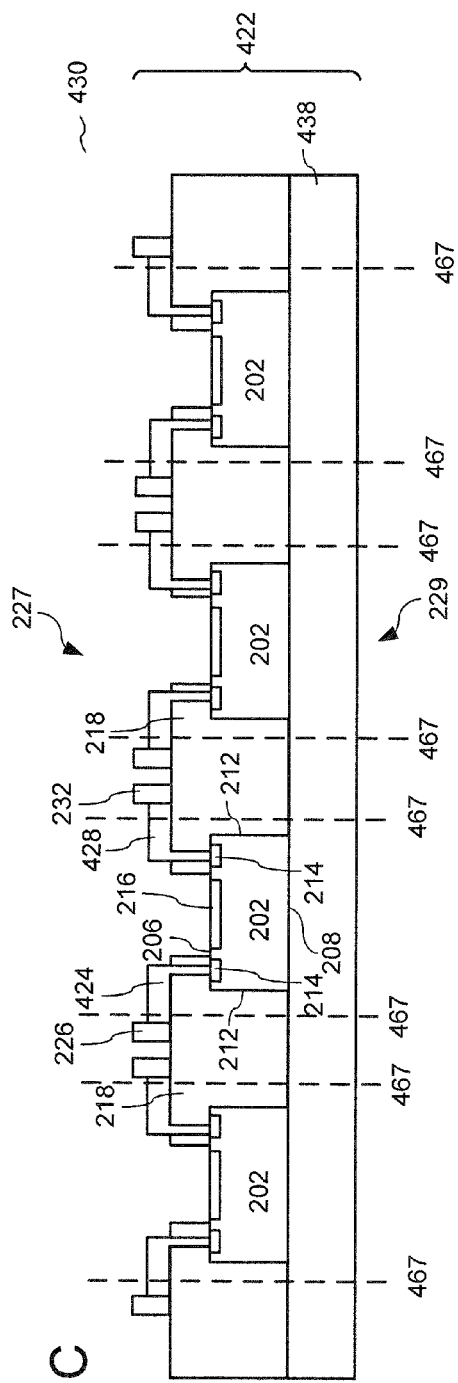

Different approaches may be used for manufacturing an embedded chip package as an intelligent test board for batch testing of sensors. FIGS. 4A to 4C show method 400 for manufacturing embedded chip package 422 according to another embodiment. Embedded chip package 422 may include a BLADE package. In an embodiment, as shown in cross-sectional view 410 of FIG. 4A, method 400 may include embedding plurality of chips 2021 to 202n, e.g. semiconductor dies, in an encapsulation material 218. As shown in view 410, plurality of chips 2021 to 202n may be placed or arranged over carrier 438, wherein chip back sides 208 may be arranged directly on and facing carrier 438. Back sides 208 of plurality of chips 2021 to 202n may be adhered to carrier 438. Back sides 208 may be electrically connected to carrier 438 or electrically insulated from carrier 438 depending on the type of electrical device and performance required from plurality of chips 2021 to 202n. If an electrically conductive contact is required from chip back sides 208, (e.g. with power devices, such as electronic devices with current flow between front side 206 and back side 208) then carrier 438 may include or be an electrically conductive material. For example, carrier 438 may include a metal or alloy of at least one of copper, nickel, iron, silver, gold and palladium.

Subsequently, as shown in view 420 of FIG. 4B, encapsulation material 218 may be formed over plurality of chips 2021 to 202n wherein encapsulation material 218 may cover chip front sides 206 and chip sidewalls 212 of plurality of chips 2021 to 202n. Encapsulation material 218 may cover one or more contact pads 214 formed on chip front sides 206, whereas sensing portions 216 may be exposed; in other words, sensing portions 216 may be substantially free from encapsulation material 218. Encapsulation material 218 may therefore at least partially surround plurality of chips 2021 to 202n. Plurality of chips 2021 to 202n may be commonly connected to each other via encapsulation material 218 and carrier 438 as shown by embedded chip package 322. Encapsulation material 218 may include an electrically insulating laminate.

Embedded chip package 422 may include plurality of chips 2021 to 202n embedded in encapsulation material 218 and formed over carrier 438. Embedded chip package 422 may be arbitrarily shaped. According to some embodiments, embedded chip package 422 may be round or rectangular in shape. Etching through selective portions of encapsulation material 218 may be carried out exposed contact pads 214 formed over each of chip front sides 206, for example to form holes over contact pads 214 by selectively removing portions of encapsulation material 218. Subsequently, electrical redistribution layers 424 and further electrical redistribution layers 428 may be formed in the through holes and over encapsulation material 218. Electrical redistribution layers 424 and further electrical redistribution layers 428 may be analogous to electrical redistribution layers 224 and further electrical redistribution layers 228 respectively.

As shown in view 430 of FIG. 4C, electrical redistribution layer 424 may be formed over encapsulation material 218, wherein electrical redistribution layer 424 may be electrically connected to plurality of chips 2021 to 202n. Electrical redistribution layer 424 may be electrically connected to a group of the plurality of chips 2021 to 202n, for example to a subset of plurality of chips 2021 to 202n, or to the entire group of the plurality of chips 2021 to 202n. Furthermore, common terminal 226 may be formed and connected to electrical redistribution layer 424. Common terminal 226 may provide an interface to at least one of transmit and receive a common electrical signal 234 between the plurality of chips, e.g. via electrical redistribution layer 424, and common terminal 226.

At least one electrical redistribution layer 424 may be formed over encapsulation material 218 in regions between plurality of chips. Electrical redistribution layer 424 may be electrically connected to a respective first contact pad 214A of each of the one or more contact pads 214. Common terminal 226 may be formed over encapsulation material 218 in regions between plurality of chips 2021 to 202n, for example over front side 227 of embedded chip package 422. At least one further electrical redistribution layer 428 may be formed over encapsulation material 218. Further electrical redistribution layer 428 may be electrically connected to plurality of chips 2021 to 202n, for example over front side 227 of embedded chip package 422. Further electrical redistribution layer 428 may be electrically connected to a respective second contact pad 214B of each of plurality of chips 2021 to 202n. Furthermore, further common terminal 232 may be formed over encapsulation material 218. Further common terminal 232 may be connected to further electrical redistribution layer 428, wherein further common terminal 232 may provide an interface to at least one of transmit and receive a further common electrical signal 236 between further electrical redistribution layer 428 and further common terminal 232.

After testing, individualization each of the plurality of chips 2021 to 202n from each other may be carried out as described according to FIG. 2I. Plurality of chips 2021 to 202n may each be individualized from each other by separating through electrical redistribution layer 424 and/or further electrical redistribution layer 428. For example, each of plurality of chips 2021 to 202n may be separated or diced away from each other by dicing through electrical redistribution layer 424 and/or further electrical redistribution layer 428, encapsulation material 218 and carrier 438. Plurality of chips 2021 to 202n may be separated from at least part of electrical redistribution layer 424 and common terminal 226. Plurality of chips 2021 to 202n may be separated from at least part of further electrical redistribution layer 428 and further common terminal 232.

Figure 5A:
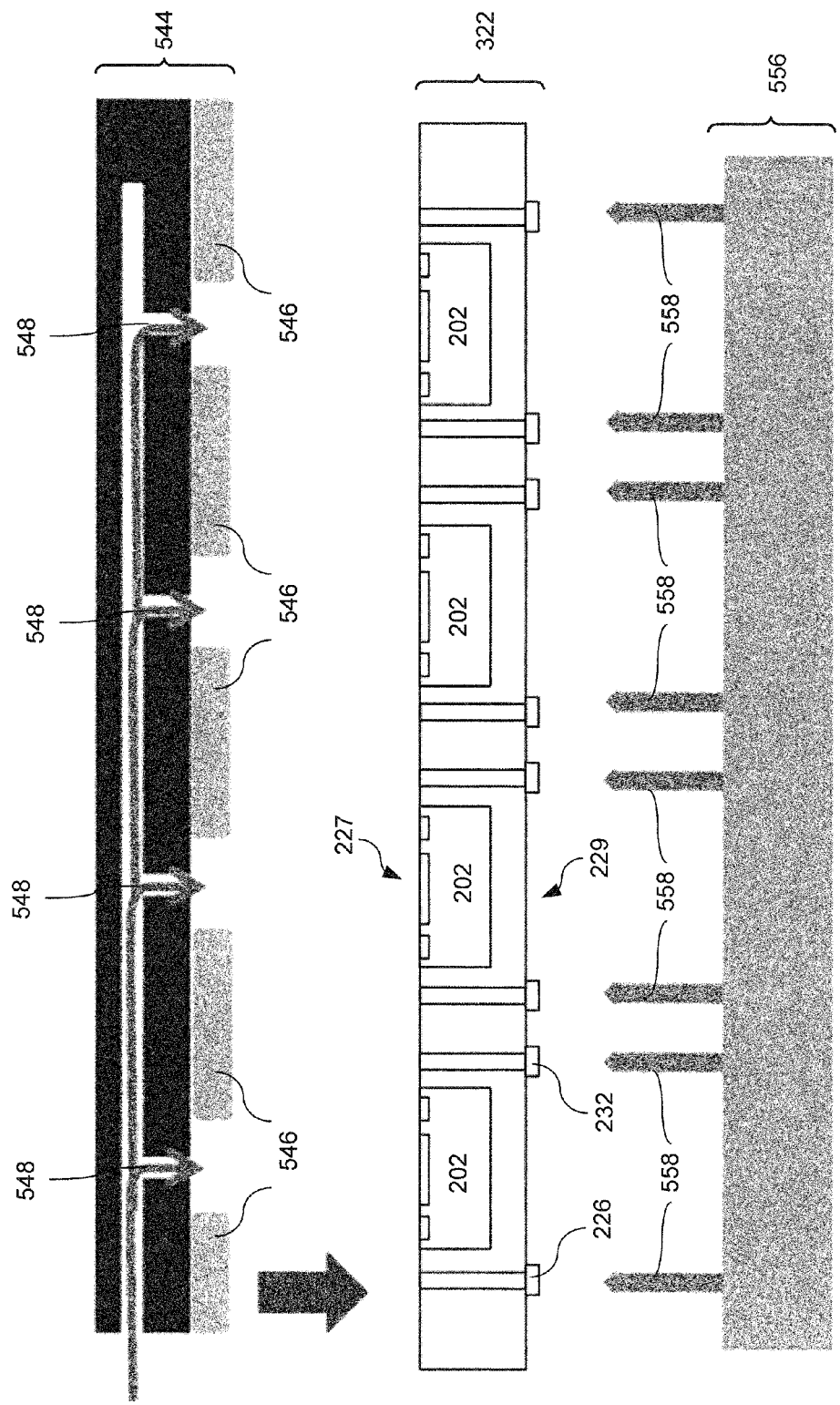
Figure 5B:
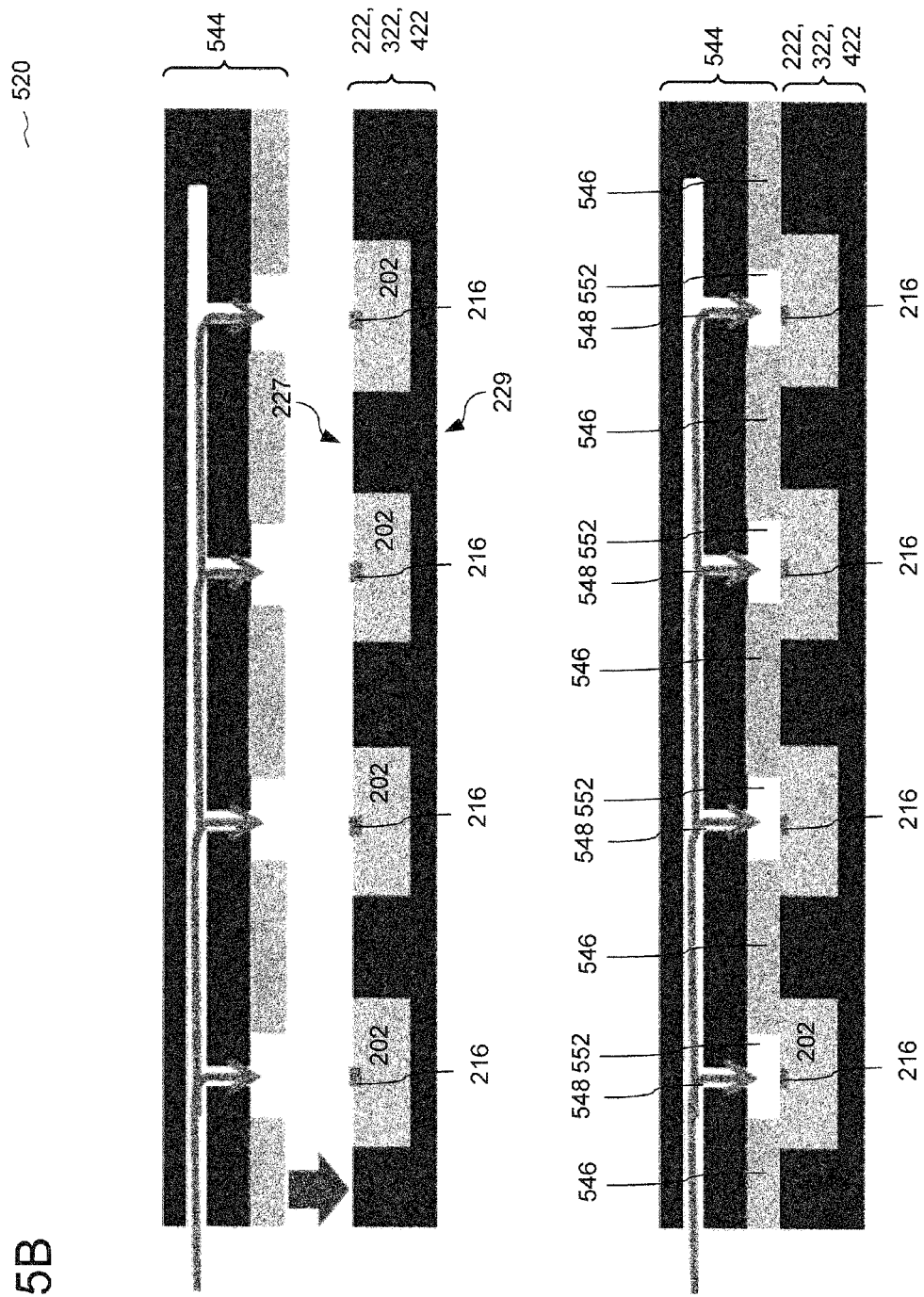

FIGS. 5A and 5B shows a testing arrangement and a method for performing testing on plurality of chips 2021 to 202n according to various embodiments.

In view 510 of FIG. 5, testing is shown to be carried out on embedded chip package 322 as an example. Common terminal 226, further common terminal 232 and output terminal 262 may be formed on chip back side 208, which may be outside the pressure chamber. It may be understood, however, that similar testing may be adapted to be carried out on any of embedded chip packages 222, 322, 422.

Embedded chip packages 222, 322, 422 may be used as an intelligent test interface and/or test board in which plurality of chips 2021 to 202n may be arranged. Fixture 544 may include one or more sealing parts 546 and one or more inlets 548, and may be used to apply pressure simultaneously to plurality of chips 2021 to 202n. In an embodiment, the test arrangement may also include test fixture 556 with test pins 558.

As shown in FIG. 5B, fixture 544 may be placed over embedded chip package, 222 and/or 322 and/or 422, e.g. over front side 227 of the embedded chip package. Each of sensing portions 216 may be separated from each other by at least one sealing part 546, e.g. soft seals. Fixture 544 may be arranged such that chambers 552 may be enclosed by sealing parts 546 and fixture 544, wherein sealing parts 546 may separate each sensing portion 216 from at least one other neighboring sensing portions 216. Each chamber 552 may include an inlet 548, wherein pressure may be applied to sensing portion 216 which may be sealed in chamber 552. For example, during a test, air at different pressures P1, P2, P3 may be applied to sensing portion 216 via inlet 548. Fixture 544 may be arranged over plurality of chips 2021 to 202n so that pressure may be applied to a plurality of sensing portions 216 of plurality of chips 2021 to 202n simultaneously.

According to the embodiment of FIG. 5B, sealing parts 546 may be arranged such that each chamber 522 may separate a single chip 202 from a neighboring chip 202.

As shown in view 530 of FIG. 5C, it may be possible to arrange sealing parts 546 over package front side 227 such that each chamber 622 may separate a plurality of chips 2021 to 202n, e.g. two chips 202, three chips 202 or more, from a neighboring plurality of chips. In other word, sealing parts 546 may be arranged between arrays of devices, e.g. reticles. Chamber 622 may include one inlet 548 which may provide a pressure to a plurality of sensing portions 216 sealed within chamber 552. Sealing parts 546 may be arranged or disposed in areas between chips 202 or arrays of chips 202. For example, between rows and/or columns of chips 202. As shown in view 540 of FIG. 5D, it may be possible to arrange sealing parts 546 over such that each chamber 622 may separate a plurality of chips 2021 to 202n, e.g. two chips 202, three chips 202 or more, from a neighboring plurality of chips. Sealing parts 546 may be arranged over a temporary carrier 574 or carrier 438. It may even be possible to arrange sealing parts 546 such that each chamber 552 may seal all chips in the embedded chip package in a single chamber, e.g. by sealing the pressure interface on a border region, e.g. a circumference of the embedded chip package. Chamber 552 may include one or more inlets 548 which may provide a pressure to all the chips in the embedded chip package within chamber 552.

Various embodiments provide an embedded chip package including: a plurality of chips; encapsulation material embedding the plurality of chips; at least one electrical redistribution layer electrically connected to the plurality of chips; and a common terminal connected to the at least one electrical redistribution layer, wherein the common terminal provides an interface to at least one of transmit and receive a common electrical signal between the plurality of chips and the common terminal (e.g. via the at least one electrical redistribution layer).

According to an embodiment, the encapsulation material at least partially surrounds the plurality of chips.

According to an embodiment, the plurality of chips are commonly connected to each other via the encapsulation material.

According to an embodiment, each or some of the plurality of chips includes a sensing portion; and one or more contact pads electrically connected to the sensing portion.

According to an embodiment, the encapsulation material covers one or more sides of each of the plurality of chips; and wherein the sensing portions of each of the plurality of chips are substantially free from the encapsulation material.

According to an embodiment, the at least one electrical redistribution layer is electrically connected to a respective first contact pad of each of the one or more contact pads.

According to an embodiment, the at least one electrical redistribution layer is formed over the encapsulation material in regions between the plurality of chips.

According to an embodiment, the common terminal is formed over the encapsulation material in regions between the plurality of chips.

According to an embodiment, the common terminal is formed at least partially in the encapsulation material.

According to an embodiment, the embedded chip package further includes at least one further electrical redistribution layer; and a further common terminal connected to the at least one further electrical redistribution layer, wherein the further common terminal provides a further interface to at least one of transmit and receive a further common electrical signal between the at least one further electrical redistribution layer and the common terminal; wherein the at least one further electrical redistribution layer is electrically connected to a respective second contact pad of each of the plurality of chips.

According to an embodiment, the embedded chip package further includes at least one further chip disposed at least partially in the encapsulation material, wherein the at least one further chip is electrically connected to the plurality of chips.

According to an embodiment, the at least one further chip is configured to at least one of transmit and receive the common electrical signal via the common terminal.

According to an embodiment, the embedded chip package further includes at least one further chip disposed at least partially in the encapsulation material, wherein the at least one further chip is electrically connected to at least one of the common terminal and the further common terminal.

According to an embodiment, the at least one further chip is configured to at least one of transmit and receive the common electrical signal via the common terminal and to at least one of transmit and receive the further common electrical signal via the further common terminal.

According to an embodiment, the at least one further chip includes at least one of a calibrating circuit, a testing circuit and a multiplexing circuit.

According to an embodiment, each sensing portion of the plurality of chips includes at least part of a pressure sensor.

Various embodiments provide a method for manufacturing an embedded chip package, the method including: embedding a plurality of chips in an encapsulation material; forming at least one electrical redistribution layer over the encapsulation material, the at least one electrical redistribution layer electrically connected to the plurality of chips; and forming a common terminal and connecting the common terminal to the at least one electrical redistribution layer, wherein the common terminal provides an interface to at least one of transmit and receive a common electrical signal between the plurality of chips, e.g. via at least one electrical redistribution layer, and the common terminal.

According to an embodiment, embedding the plurality of chips in the encapsulation material includes forming encapsulation material over one or more sides of each of the plurality of chips wherein the sensing portions of each of the plurality of chips are substantially free from the encapsulation material.

According to an embodiment, each chip of the plurality of chips includes one or more contact pads; and the method further includes electrically connecting the at least one electrical redistribution layer to a respective first contact pad of each of one or more contact pads.

According to an embodiment, forming the at least one electrical redistribution layer over the encapsulation material includes forming the at least one electrical redistribution layer in regions between the plurality of chips.

According to an embodiment, the method further includes forming the common terminal over the encapsulation material in regions between the plurality of chips.

According to an embodiment, the method further includes forming at least one further electrical redistribution layer over the encapsulation material, the at least one further electrical redistribution layer electrically connected to the plurality of chips; and forming a further common terminal and connecting the further common terminal to the at least one further electrical redistribution layer, wherein the further common terminal provides an interface to at least one of transmit and receive a further common electrical signal between the at least one further electrical redistribution layer and the further common terminal.

According to an embodiment, the method further includes disposing at least one further chip at least partially in the encapsulation material, wherein the at least one further chip is configured to at least one of transmit and receive the common electrical signal via the common terminal.

According to an embodiment, the method further includes disposing at least one further chip at least partially in the encapsulation material, wherein the at least one further chip is configured to at least one of transmit and receive the common electrical signal via the common terminal and to at least one of transmit and receive the further common electrical signal via the further common terminal.

According to an embodiment, the method further includes individualizing the plurality of chips from each other by separating through the at least one electrical redistribution layer.

According to an embodiment, the method further includes separating the plurality of chips from at least part of the at least one electrical redistribution layer and the common terminal.

Various embodiments provide a chip package including: a chip including a sensing portion and one or more contact pads electrically connected to the sensing portion; and an electrical redistribution layer electrically contacting the at least one contact pad, wherein the electrical redistribution layer extends from the at least one contact pad to a sidewall of the chip package, wherein a portion of the electrical redistribution layer is exposed at the sidewall of the chip package.

According to an embodiment, the chip package further includes electrically insulating material at least partially surrounding the chip and the electrical redistribution layer, wherein the portion of the electrical redistribution layer exposed at the sidewall of the chip package electrical redistribution layer is free of electrically insulating material.

According to an embodiment, the chip package further includes an electrical interconnect electrically contacting the at least one contact pad and at least partially surrounded by the electrically insulating material, wherein at least part of the electrical interconnect is connected to a solder structure formed over the electrically insulating material.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An embedded chip package comprising:
   a plurality of chips;
   encapsulation material embedding the plurality of chips;
   at least one electrical redistribution layer electrically connected to the plurality of chips, wherein the at least one electrical redistribution layer is formed over the encapsulation material in regions between the plurality of chips; and
   a common terminal connected to the at least one electrical redistribution layer, wherein the common terminal provides an interface to at least one of transmit and receive a common electrical signal between the plurality of chips and the common terminal.

2. The embedded chip package according to claim 1, wherein the encapsulation material at least partially surrounds the plurality of chips.

3. The embedded chip package according to claim 1, wherein the plurality of chips are commonly connected to each other via the encapsulation material.

4. The embedded chip package according to claim 1, wherein at least some of the plurality of chips comprises a sensing portion; and
   one or more contact pads electrically connected to the sensing portion.

5. The embedded chip package according to claim 4, wherein the encapsulation material covers one or more sides of each of the plurality of chips; and
   wherein the sensing portions of each of the plurality of chips are substantially free from the encapsulation material.

6. The embedded chip package according to claim 4, wherein the at least one electrical redistribution layer is electrically connected to a respective first contact pad of each of the one or more contact pads.

7. The embedded chip package according to claim 1, wherein the common terminal is formed over the encapsulation material in regions between the plurality of chips.

8. The embedded chip package according to claim 1, wherein the common terminal is formed at least partially in the encapsulation material.

9. The embedded chip package according to claim 6, further comprising
   at least one further electrical redistribution layer; and
   a further common terminal connected to the at least one further electrical redistribution layer, wherein the further common terminal provides a further interface to at least one of transmit and receive a further common electrical signal between the at least one further electrical redistribution layer and the common terminal;
   wherein the at least one further electrical redistribution layer is electrically connected to a respective second contact pad of each of the plurality of chips.

10. The embedded chip package according to claim 1, further comprising
    at least one further chip disposed at least partially in the encapsulation material, wherein the at least one further chip is electrically connected to the plurality of chips.

11. The embedded chip package according to claim 10, wherein the at least one further chip is configured to at least one of transmit and receive the common electrical signal via the common terminal.

12. The embedded chip package according to claim 9, further comprising
    at least one further chip disposed at least partially in the encapsulation material, wherein the at least one further chip is electrically connected to at least one of the common terminal and the further common terminal.

13. The embedded chip package according to claim 9, wherein the at least one further chip is configured to at least one of transmit and receive the common electrical signal via the common terminal and to at least one of transmit and receive the further common electrical signal via the further common terminal.

14. The embedded chip package according to claim 13, wherein the at least one further chip comprises at least one of a calibrating circuit, a testing circuit and a multiplexing circuit.

15. The embedded chip package according to claim 4, wherein each sensing portion of the plurality of chips comprises at least part of a pressure sensor.

16. A chip package comprising:
a chip comprising a sensing portion and one or more contact pads electrically connected to the sensing portion;
encapsulation material embedding the chip;
an electrical redistribution layer electrically contacting the at least one contact pad, wherein the electrical redistribution layer extends from the at least one contact pad to a sidewall of the chip package, wherein a portion of the electrical redistribution layer is exposed at the sidewall of the chip package; and
wherein the electrical redistribution layer is formed over the encapsulation material laterally outside the chip.

17. The chip package according to claim 16, further comprising electrically insulating material at least partially surrounding the chip and the electrical redistribution layer, and
wherein the portion of the electrical redistribution layer exposed at the sidewall of the chip package electrical redistribution layer is free of electrically insulating material.

18. The chip package according to claim 16, further comprising an electrical interconnect electrically contacting the at least one contact pad and at least partially surrounded by the electrically insulating material,
wherein at least part of the electrical interconnect is connected to a solder structure formed over the electrically insulating material.

19. An embedded chip package comprising:
a plurality of chips, wherein at least some of the plurality of chips comprises a sensing portion and one or more contact pads electrically connected to the sensing portion, wherein each sensing portion of the plurality of chips comprises at least part of a pressure sensor;
encapsulation material embedding the plurality of chips;
at least one electrical redistribution layer electrically connected to the plurality of chips; and
a common terminal connected to the at least one electrical redistribution layer,
wherein the common terminal provides an interface to at least one of transmit and receive a common electrical signal between the plurality of chips and the common terminal.

* * * * *